PTH39 XR 4,004,409 SR

United States Patent [19]

[11] 4,004,409

[45] Jan. 25, 1977

Ganter et al.

[54] WATCH HAVING A PIEZO ELECTRIC BUZZER MECHANISM

[75] Inventors: Wolfgang Ganter, Schramberg; Albert Ginter, Lauterbach, both of Germany

[73] Assignee: Gebruder Junghans GmbH, Germany

[22] Filed: Jan. 29, 1976

[21] Appl. No.: 653,622

[30] Foreign Application Priority Data

Jan. 30, 1975 Germany .................... 7502680[U]

[52] U.S. Cl. .................................... 58/38 R; 58/55; 58/57.5; 310/9.1; 340/384 E; 340/388

[51] Int. Cl.[2] ................. G04C 21/34; H01L 27/20; G08B 3/02

[58] Field of Search ........... 58/23 AC, 38, 55, 57.5, 58/152 B; 310/8.9, 9.1; 340/384 RE, 388, 391

[56] References Cited

UNITED STATES PATENTS 3,788,060 1/1974 Kawamura ............................ 58/38
3,800,523 4/1974 Yamazaki ............................ 58/55
3,842,585 10/1974 Lupol ............................ 58/55
3,940,919 3/1976 Yasuda et al. .................... 58/38 R

*Primary Examiner*—E. S. Jackmon
*Attorney, Agent, or Firm*—Burns, Doane, Swecker & Mathis

[57] ABSTRACT

A watch includes a housing including an apertured sound transmitting housing portion. A diaphragm is carried by the housing. A piezo electric element is carried by one surface of the diaphragm and is oscillatable in response to electrical excitation. Excitation circuitry is connected between the piezo electrical element and a power source of a watch in producing an excitation signal to oscillate the piezo electric element. The diaphragm comprises an electrically insulative material. The excitation circuit is carried by the one surface of the diaphragm, thereby eliminating the need for additional components to carry the excitation circuit.

7 Claims, 2 Drawing Figures

WATCH HAVING A PIEZO ELECTRIC BUZZER MECHANISM

BACKGROUND AND OBJECTS

This invention concerns a piezo electric buzzer mechanism in a watch. More particularly, the invention relates to watches having a diaphragm which carries on an inside surface, a piezo element, the piezo element being triggered by an electronic circuit and stimulated to oscillations. A housing bottom is provided having outlet openings to transmit sound.

There are watches already known having an electronic buzzer, e.g., see U.S. Pat. No. 3,788,060 and German Pat. No. 2,215,768. The U.S. patent is hereby incorporated by reference as if set forth at length herein. Through these publications buzzers in watches have known, the electronic circuit arrangement of which being disposed between a plate and a housing bottom for the purpose of excitation of oscillations. As can be gathered especially from the U.S. Pat. No. 3,788,060, this electronic circuit arrangement is located in a space between the bridge of a train of wheels or mechanism for the hands and the inside of a diaphragm. Through the German Pat. No. 2,215,768 it has been known to develop, as a sealing element, a diaphragm having a piezo element on its inside. In the case of the buzzer arrangements heretofore proposed, the circuit arrangement for the piezoelectric buzzer is disposed on a separate plate. However, an additional plate requires additional measures in a watch housing beside the expenditure in space and costs, conditional thereon, especially places for bearing and attaching, as a result of which the originally limited space of the actual movement will be even more limited.

Starting out from the previously described problems, it is, therefore, an object of the innovation to provide a watch with a piezo electric buzzer arrangement which minimizes space and part requirements.

It is another object of the invention to arrange circuitry for a piezo electric buzzer in a watch on a standard component of the watch which has other utility, i.e., it cannot be eliminated due to its other function so that additional space consuming components are not required.

In addition, it also is an object of the invention to develop the component bearing the electronic buzzer circuitry in such a way that it can also be used as a sealing element in order to achieve a sufficient watertightness and so that it can be produced and assembled economically in accordance with a customary mass production processes.

BRIEF SUMMARY

These objects will be achieved by the present invention as hereinafter described and claimed. More particularly, the present invention relates to a watch which has a housing, including an apertured, sound transmitting housing portion. A diaphragm is carried by the housing. A piezo electric element is carried by one surface of the diaphragm and is oscillatable in response to electrical excitation. An excitation circuit is connected between the piezo elements and a power source for the watch for producing an excitation signal to oscillate the piezo electric element. The improvement contributed by the present invention includes the diaphragm being comprised of an electrically insulative material, and the excitation circuit being carried by said one surface of the diaphragm. In this fashion, there is no need to provide an extra component within the watch for the purpose of carrying the excitation circuitry.

THE DRAWINGS

In the following, a preferred embodiment of the innovation is described by way of example in conjunction with the drawings in which:

FIG. 1 is a cross-sectional view through a lower portion of a watch carrying a piezo electric buzzer arrangement according to the invention; and FIG. 2 is a view similar to FIG. 1 of a modified form of the invention.

DETAILED DESCRIPTION

Figure 1:
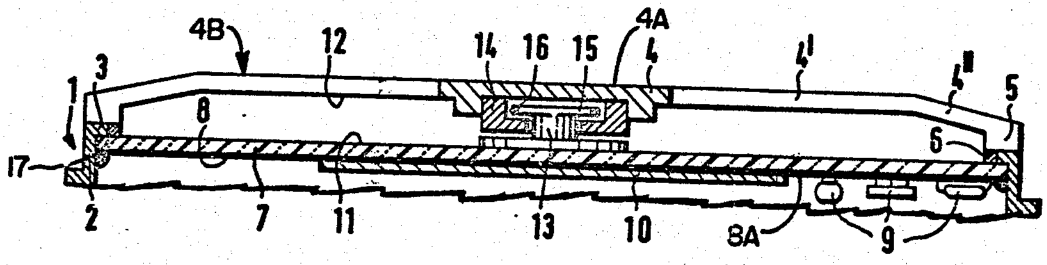

In FIG. 1, there is depicted a portion of a piezo electric buzzer mechanism of a watch. The numeral 1 designates a partially shown housing, namely the bottom part in an inverted condition. Such housing part has an outside housing wall 2 which has been widened at its lower end to form a holding edge 3. This holding edge 3 projects radially into the inside of the housing. On this holding edge 3, a housing bottom unit 4 rests. The bottom unit 4 includes a center section 4A and a circular ring-shaped primary bridge 5. The bridge 5 is axially spaced from the plane of the center section 4A, i.e., is non-coplanar relative thereto. The bridge 5 thus forms the outside peripheral limitation of the bottom unit 4. A likewise circular ringshaped secondary bridge 6 has been moulded onto the primary bridge 5 and forms an axial extension of the latter. The secondary bridge 6 has a smaller outside diameter than the primary bridge 5 and fits inside against the holding edge 3. The secondary bridge 6 thus causes a centering of the housing bottom unit 4 and makes possible a good attachment of of the latter to the housing wall 2.

The primary bridge 5 is connected to the center section 4A by a series of generally radially extending arms 4B. Between the arms are defined a number of slit-shaped outlet apertures 4' for transmitting sound. The arms 4B each include a slanted or oblique facet 4" on its outside periphery, as a result of which the entire housing bottom need not sit on the arm of a person carrying the watch. This measure furthermore causes an increase in the degree of effectiveness of the signal delivered by the buzzer.

Numeral 7 designates a diaphragm which is formed of the insulating material, e.g., epoxy glass. On the inside surface 8 of the diaphragm, facing away from the housing bottom unit 4, the diaphragm 7 is coated with an electrically conductive material 8A, e.g., copper which is etched to form the conducting paths of the electronic circuit arrangement for the buzzer. The corresponding conventional electronic components, designated by numeral 9, are permanently connected to these paths. Furthermore, a piezo electric element 10 in the form of a circular lamella is attached centrically and rigidly on the inside surface 8 of the diaphragm 7 by a direct connection or through the conductive material 8A.

The components 9 are electrically connected to the source of electrical power for the watch as is fully explained in the aforementioned U.S. Pat. No. 3,788,060. These components, together with their conductive paths (formed by the etched layer 8A), constitute an excitation circuit. Such excitation circuit is electrically connected between the power source for the watch (e.g., a battery) and the piezo electric element and, when switch-on, produces an electrical excitation signal which is transmitted to the piezo electric element to oscillate the latter and produce a buzzing sound. The components 9 can include, for example, transistors, rectifiers or detectors, resistors, condenso inductors, etc. in conventional arrangements.

Figure 2:
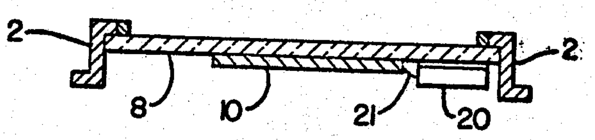

Instead of the electrical paths and components being individually secured to the diaphragm, such excitation circuitry could be initially mounted on an electronic block or module 20 (FIG. 2) which is then placed on and attached as a unit to the inside surface 8 of the diaphragm. The circuitry is connected to the piezo element via wires 21 or by suitable etched paths.

A safety arrangement, consisting of a safety bolt 13 and a safety plate 14, is provided between an outside surface 11 of the diaphragm 7 and an inside surface 12 of the housing bottom unit 4. This safety arrangement prevents the destruction of, or impermissible strong deformation of, the diaphragm 7 when acted upon by too high a pressure. The safety bolt 13 is attached rigidly and centrally on the outside surface 11 of the diaphragm 7. The safety plate 14 is secured to the inside surface 12 of the housing bottom 4. A head 15 is molded onto the safety bolt 13, which head is disposed axially movably in a recess 16 in the safety plate 14. The depth of the recess 16 also limits the stroke or amplitude of movement of the diaphragm 7 with the safety bolt 13. Unduly large forces acting on the diaphragm 7 are then absorbed by the housing bottom unit 4, via the two cooperating safety elements 13 and 14.

The diaphragm 7, as shown in the drawing, fits against the inside surface 17 of the holding edge 3 and is glued to that surface and to the housing wall 2 as well. In case of a precise execution of the glueing, there is then a sufficient watertightness of the watch.

An inexpensive, easily manufactured arrangement has thus been created to fulfill the objects of the present invention. There is eliminated the need for a separate component for carrying the electrical paths and components of the buzzer mechanism. Consequently, problems of space, mounting, cost, etc. are alleviated.

Although the invention has been described in connection with a preferred embodiment thereof, it will be appreciated by those skilled in the art that additions, modifications, substitutions and deletions not specifically described may be made without departing from the spirit and scope of the invention as defined in the appended claims.

What is claimed is:

1. In a watch having housing means, including an apertured sound transmitting portion; a diaphragm carried by said housing means; a piezo electric element carried by one surface of said diaphragm and being oscillatable in response to electrical excitation, and an excitation circuit connected between said piezo electric element and a power source for said watch for producing an excitation signal to oscillate said piezo electric element, the improvement wherein:
   - said diaphragm comprises an electrically insulative material, and
   - said excitation circuit being carried by said one surface of said diaphragm.

2. Apparatus according to claim 1 wherein said diaphragm carries an etched electrically conductive metal layer on said one surface, said etched layer forming conducting paths for said excitation circuit.

3. Apparatus according to claim 2 wherein electronic components of said excitation circuit are connected with said etched conducting paths.

4. Apparatus according to claim 1 wherein said excitation circuit is formed on a module which is attached on said one surface of said diaphragm.

5. Apparatus according to claim 1 wherein said diaphragm comprises lamination coated epoxy-glass plate.

6. Apparatus according to claim 1 wherein said one surface of said diaphragm comprises an inside surface thereof facing away from said apertured housing portion.

7. Apparatus according to claim 1 wherein said diaphragm is glued to said housing in a manner producing a watertight connection.

* * * * *